(12) United States Patent
Kasama et al.

(10) Patent No.: US 7,495,307 B2
(45) Date of Patent: Feb. 24, 2009

(54) COLUMNAR ELECTRIC DEVICE

(75) Inventors: Yasuhiko Kasama, Sendai (JP); Kenji Omote, Sendai (JP)

(73) Assignee: Ideal Star Inc., Miyagi (JP)

( * ) Notice: Subject to any disclaimer, the term of this patent is extended or adjusted under 35 U.S.C. 154(b) by 0 days.

(21) Appl. No.: 10/579,920

(22) PCT Filed: Nov. 22, 2004

(86) PCT No.: PCT/JP2004/017367

§ 371 (c)(1),
(2), (4) Date: Jul. 7, 2006

(87) PCT Pub. No.: WO2005/050745

PCT Pub. Date: Jun. 2, 2005

(65) Prior Publication Data

US 2007/0108556 A1    May 17, 2007

(30) Foreign Application Priority Data

Nov. 20, 2003    (JP) ............................. 2003-390149

(51) Int. Cl.
*H01L 31/00* (2006.01)
(52) U.S. Cl. .................................. 257/459; 136/206
(58) Field of Classification Search ................ 136/205, 136/206, 252; 257/459, 465
See application file for complete search history.

(56) References Cited

U.S. PATENT DOCUMENTS

| | | | | |
|---|---|---|---|---|
| 6,913,713 B2* | 7/2005 | Chittibabu et al. | ....... | 252/501.1 |
| 6,933,600 B2* | 8/2005 | Wu et al. | ..................... | 257/691 |
| 6,979,544 B2* | 12/2005 | Keen | .............................. | 435/6 |
| 7,044,005 B2* | 5/2006 | Koyama et al. | ........ | 73/862.333 |
| 2002/0151823 A1* | 10/2002 | Miyata et al. | ............... | 600/585 |
| 2002/0195442 A1* | 12/2002 | Lee | ............................. | 219/505 |
| 2006/0283242 A1* | 12/2006 | Kunow et al. | ................. | 73/161 |

FOREIGN PATENT DOCUMENTS

| | | |
|---|---|---|
| JP | 60-42876 | 3/1985 |
| JP | 2-304903 | 12/1990 |
| JP | 5-41324 | 2/1993 |
| JP | 10-256579 | 9/1998 |
| JP | 2004/194137 | 7/2004 |
| WO | WO 03/094238 | 11/2003 |
| WO | WO 2005/018003 | 2/2005 |

* cited by examiner

*Primary Examiner*—Thao P. Le
(74) *Attorney, Agent, or Firm*—Young & Thompson

(57) ABSTRACT

A sensor whose size can be decreased without marring the performance and which can be installed in a narrow place, an electric device, and a method for easily manufacturing the electric device. By vacuum deposition of semiconductor on a columnar body or by applying a melt, solution, or gel of semiconductor to the columnar body, a coating of semiconductor is formed. Four insulating wires, a stripe band of the connected four insulating wires are wound around the columnar body. Then, one of the insulating wires is removed to form a copper wire in the vacant portion by copper vacuum deposition. Lastly, another insulating wire not adjacent to the copper wire is removed to form an aluminum wire in the vacant portion by aluminum vacuum deposition. By measuring the resistance between the copper and aluminum wires, the intensity of light striking the semiconductor can be determined.

2 Claims, 13 Drawing Sheets

(a)        (b)        (c)

COLUMNAR ELECTRIC DEVICE

CROSS-REFERENCE TO RELATED APPLICATION

This application is a 371 of PCT/JP04/17367, filed on Nov. 22, 2004 which claims the benefit of Japan Patent Application No. 2003-390149, filed on Nov. 20, 2003, the contents of which are hereby incorporated herein by reference in their entirety.

TECHNICAL FIELD

The present invention relates to a columnar electric device including a sensor, solar cell, and the like, and a production method thereof. Particularly, the present invention relates to an electric device which can be downsized without degradation of a performance and can be mounted even in a narrow place, and a method for readily producing the electric device.

BACKGROUND ART

Patent-Related Reference 1: JP-A-11-295255
Patent-Related Reference 2: JP-A-2003-161713

In the patent-related reference 1, it is mentioned that various gas sensors having different gas response properties can be obtained by providing two comb-shaped electrodes on a glass substrate, and by additionally forming thereon a sensitive film made from two kinds of mixed electroconductive polymers.

Further, mentioned in the patent-related reference 2 is an ammonia gas sensor including: an electrically insulative ceramic substrate; two comb-shaped electrodes formed thereon; and an ammonia sensitive layered film formed to extend over the two comb-shaped electrodes.

In each of the patent-related references, two pieces of metal are worked into comb shapes, respectively, and placed on one side of the associated rectangular parallelepiped substrate. Such a sensor has a limitation of downsizing while keeping a performance, thereby problematically making it difficult to mount the sensor on a readily recognizable portion such as a gas piping.

DISCLOSURE OF THE INVENTION

Problem to be Solved by the Invention

It is therefore an object of the present invention to provide a columnar electric device such as a sensor, solar cell, and the like which can be downsized without degradation of a performance and can be mounted even in a narrow place, and a method for readily producing such a columnar electric device.

Means for Solving the Problem

A first embodiment of the invention resides in a production method of a columnar electric device, characterized in that the method comprises the steps of:
helically winding a mask material onto an outer periphery of an insulative columnar body; and
coating an electroconductive substance onto the outer periphery of the columnar body through a helical gap defined by the mask material, thereby forming an electroconductive wire.

A second embodiment resides in a production method of a columnar electric device, characterized in that the method comprises the steps of:
winding, onto an outer periphery of an insulative columnar body, a plate-like product obtained by mutually joining two or more linear substances into a stripe shape;
subsequently peeling off a part of the linear substances so as to coat an electroconductive substance onto the outer periphery through a trace of the peeled linear substance, to thereby form an electroconductive wire; and
peeling off the remaining linear substances.

A third embodiment resides in a production method of a columnar electric device, characterized in that the method comprises the steps of:
winding, onto an outer periphery of an insulative columnar body, a plate-like product obtained by mutually joining two or more insulative wires into a stripe shape; and
subsequently peeling off a part of the insulative wires so as to coat an electroconductive substance onto the outer periphery through a trace of the peeled insulative wire, to thereby form an electroconductive wire.

A fourth embodiment resides in a production method of a columnar electric device, characterized in that the method comprises the step of:
winding, onto an outer periphery of an insulative columnar body, a plate-like product obtained by mutually joining two or more electroconductive wires into a stripe shape; and
subsequently peeling off a part of the electroconductive wires.

A fifth embodiment resides in a production method of a columnar electric device, characterized in that the method comprises the step of:
winding, onto an outer periphery of an insulative columnar body, a plate-like product obtained by mutually joining an electroconductive wire and an insulative wire into a stripe shape in a staggered manner.

A sixth embodiment resides in the production method of a columnar electric device of any one of the preceding first through fifth embodiments, characterized in that the columnar electric device is a sensor or solar cell.

A seventh embodiment resides in a columnar electric device characterized in that the columnar electric device comprises:
an insulative columnar body; and
an electroconductive wire helically wound around an outer periphery of the insulative columnar body.

This electric device is produced by the method of any one of thge preceding first through fifth embodiments, for example, An eighth embodiment resides in the columnar electric device of the foregoing device, characterized in that the columnar body is a fibrous body.

A ninth embodiment resides in a production method of a columnar electric device, characterized in that the method comprises the steps of:
coating a semiconductor onto an outer periphery of an insulative columnar body;
subsequently, helically winding a first mask material onto an outside of the semiconductor;
coating a first electroconductive substance onto the outside through a helical gap defined by the first mask material, to thereby form a first electroconductive wire;
thereafter removing the first mask material;
subsequently, helically winding a second mask material onto the outside in a manner to cover the first electroconductive wire; and coating a second electroconductive substance onto the outside through a helical gap defined by the second mask material, to thereby form a second electroconductive wire.

A tenth embodiment resides in a production method of a columnar electric device, characterized in that the method comprises the steps of:
- coating a semiconductor onto an outer periphery of an insulative columnar body;
- subsequently winding four or more linear substances onto an outside of the semiconductor;
- thereafter peeling off one or more of the linear substances, and coating a first electroconductive substance onto the outside through a trace of the peeled linear substances, to thereby form a first electroconductive wire;
- peeling off one or more of the linear substances, which is/are not neighboring to the first electroconductive wire, and coating a second electroconductive substance onto the outside through a trace of the peeled linear substances, to thereby form a second electroconductive wire; and
- peeling off the remaining linear substances.

An eleventh embodiment resides in a production method of a columnar electric device, characterized in that the method comprises the steps of:
- coating a semiconductor onto an outer periphery of an insulative columnar body;
- subsequently winding, onto an outside of the semiconductor, a plate-like product obtained by mutually joining four or more insulative wires into a stripe shape;
- thereafter peeling one or more of the insulative wires, and coating a first electroconductive substance onto the outside through a trace of the peeled insulative wires, to thereby form a first electroconductive wire; and
- peeling off one or more of the insulative wires, which is/are not neighboring to the first electroconductive wire, and coating a second electroconductive substance onto the outside through a trace of the peeled insulative wires, to thereby form a second electroconductive wire.

A twelfth embodiment resides in a production method of a columnar electric device, characterized in that the method comprises the steps of:
- coating a semiconductor onto an outer periphery of an insulative columnar body;
- subsequently winding, onto an outside of the semiconductor, a plate-like product obtained by mutually joining four or more electroconductive wires into a stripe shape; and
- thereafter peeling off two of the electroconductive wires, which are separated from each other by at least one of the electroconductive wires therebetween.

A thirteenth embodiment resides in a production method of a columnar electric device, characterized in that the method comprises the steps of:
- coating a semiconductor onto an outer periphery of an insulative columnar body; and
- subsequently winding, onto an outside of the semiconductor, a plate-like product obtained by mutually joining two electroconductive wires and two insulative wires into a stripe shape in a staggered manner.

A fourteenth embodiment resides in a production method of a columnar electric device, characterized in that the method comprises the steps of:
- coating a semiconductor onto an outer periphery of an insulative columnar body;
- subsequently winding, onto an outside of the semiconductor, a plate-like product obtained by mutually joining one electroconductive wire comprising a first electroconductive substance and three insulative wires into a stripe shape; and
- thereafter peeling off the insulative wire, which is not neighboring to the first electroconductive wire, and coating a second electroconductive substance onto the outside through a trace of the peeled insulative wire to thereby form a second electroconductive wire.

A fifteenth embodiment resides in the production method of a columnar electric device of any one of the foregoing ninth through fourteenth embodiments, characterized in that the columnar electric device is a sensor or solar cell.

A sixteenth embodiment resides in a columnar electric device characterized in that the columnar electric device comprises:
- an insulative columnar body;
- a semiconductor coated plate-like shape on an outer periphery of the insulative columnar body; and
- two electroconductive wires which are mutually parallel and helically wound around an outside of the semiconductor.

This electric device is produced by the method of any one of the preceding ninth through fourteenth embodiments, for example.

A seventeenth embodiment resides in the columnar electric device of the fourteenth embodiment, characterized in that the columnar body is a fibrous body.

An eighteenth embodiment resides in a solar cell characterized in that the solar cell comprises:
- an insulative columnar body;
- an organic semiconductor coated on an outer periphery of the insulative columnar body; and
- a gold wire and an aluminum wire which are mutually parallel and helically wound around an outside of the organic semiconductor.

This solar cell is produced by the method of any one of the ninth through fourteenth embodiments, for example.

A nineteenth embodiment resides in the solar cell as described above, characterized in that the columnar body is a fibrous body.

A twentieth embodiment resides in a production method of a columnar electric device, characterized in that the method comprises the steps of:
- helically winding a first mask material onto an outer periphery of an insulative columnar body;
- coating a first electroconductive substance onto the outer periphery through a helical gap defined by the first mask material, to thereby form a first electroconductive wire;
- thereafter removing the first mask material;
- subsequently, helically winding a second mask material onto the outer periphery in a manner to cover the first electroconductive wire;
- coating a second electroconductive substance onto the outer periphery through a helical gap defined by the second mask material, to thereby form a second electroconductive wire;
- thereafter removing the second mask material; and
- coating a semiconductor onto the outer periphery through each helical gap defined by the two electroconductive wires therebetween.

A twenty-first embodiment resides in a production method of a columnar electric device, characterized in that the method comprises the steps of:
- winding, onto an outer periphery of an insulative columnar body, a plate-like product obtained by mutually joining four or more linear substances into a stripe shape;

thereafter peeling off one or more of the linear substances, and coating a first electroconductive substance onto the outer periphery through a trace of the peeled linear substances, to thereby form a first electroconductive wire;

peeling off one or more of the linear substances, which is/are not neighboring to the first electroconductive wire, and coating a second electroconductive substance onto the outer periphery through a trace of the peeled linear substances, to thereby form a second electroconductive wire, and peeling off the remaining linear substances, and coating a semiconductor onto the outer periphery through a trace of the peeled linear substances.

A twenty-second embodiment resides in a production method of a columnar electric device, characterized in that the method comprises the steps of:

winding, onto an outer periphery of an insulative columnar body, a plate-like substance obtained by mutually joining four or more semiconductor wires into a stripe shape;

thereafter peeling off one or more of the semiconductor wires, and coating a first electroconductive substance onto the outer periphery through a trace of the peeled semiconductor wires, to thereby form a first electroconductive wire; and peeling off one or more of the semiconductor wires, which is/are not neighboring to the first electroconductive wire, and coating a second electroconductive substance onto the outer periphery through a trace of the peeled semiconductor wires, to thereby form a second electroconductive wire.

A twenty-third embodiment resides in a production method of a columnar electric device, characterized in that the method comprises the steps of:

winding, onto an outer periphery of an insulative columnar body, a plate-like substance obtained by mutually joining four or more electroconductive wires into a stripe shape; and thereafter peeling off two of the electroconductive wires, which are separated from each other by at least one of the electroconductive wires therebetween, and coating a semiconductor onto the outer periphery through traces of the peeled electroconductive wires.

A twenty-fourth embodiment resides in a production method of a columnar electric device, characterized in that the method comprises the step of:

winding, onto an outer periphery of an insulative columnar body, a plate-like product obtained by mutually joining two electroconductive wires and two insulative wires into a stripe shape in a staggered manner.

A twenty-fifth embodiment resides in a production method of a columnar electric device, characterized in that the method comprises the steps of:

winding, onto an outer periphery of an electroconductive columnar body, a plate-like product obtained by mutually joining one electroconductive wire comprising a first electroconductive substance and three semiconductor wires into a stripe shape; and thereafter peeling off the semiconductor wire, which is not neighboring to the first electroconductive wire, and coating a second electroconductive substance onto the outer periphery through a trace of the peeled semiconductor wire, to thereby form a second electroconductive wire.

A twenty-sixth embodiment resides in the production method of a columnar electric device of any one of the five immediately foregoing methods, characterized in that the columnar electric device is a sensor or solar cell.

A twenty-seventh embodiment resides in a columnar electric device characterized in that the columnar electric device comprises:

an insulative columnar body;

two electroconductive wires which are mutually parallel and helically wound around an outer periphery of the insulative columnar body; and a semiconductor coated on the outer periphery along each helical gap defined by the two electroconductive wires therebetween.

This electric device is produced by the method of any one of the twentiety through twenty-fifth embodiments, for example.

A twenty-eighth embodiment resides in the columnar electric device of the twenty-seventh embodiment, characterized in that the columnar body is a fibrous body.

A twenty-ninth embodiment resides in a solar cell characterized in that the solar cell comprises:

an insulative columnar body;

a gold wire and an aluminum wire which are mutually parallel and helically wound on an outer periphery of the insulative columnar body; and an organic semiconductor coated on the outer periphery along each helical gap defined by the gold wire and the aluminum wire therebetween.

This solar cell is produced by the method of any one of the twentieth through twenty-fifth embodiments, for example.

A thirtieth embodiment resides in the solar cell of the twenty-ninth embodiment, characterized in that the columnar body is a fibrous body.

A thirty-first embodiment resides in a production method of a columnar electric device, characterized in that the method comprises the steps of:

coating a first semiconductor onto an outer periphery of an insulative columnar body;

subsequently, helically winding a first mask material onto an outside of the first semiconductor;

coating a first electroconductive substance onto the outside through a helical gap defined by the first mask material, to thereby form a first electroconductive wire;

thereafter removing the first mask material;

subsequently, helically winding a second mask material in a manner to cover the first electroconductive wire;

coating a second electroconductive substance onto the outside through a helical gap defined by the second mask material, to thereby form a second electroconductive wire, thereafter removing the second mask material; and coating a second semiconductor onto the outside through each helical gap defined by the two electroconductive wires therebetween.

A thirty-second embodiment resides in a production method of a columnar electric device, characterized in that the method comprises the steps of:

coating a first semiconductor onto an outer periphery of an insulative columnar body;

subsequently winding, onto an outside of the first semiconductor, a plate-like product obtained by mutually joining four or more linear substances into a stripe shape;

thereafter peeling off one or more of the linear substances, and coating a first electroconductive substance onto the outside through a trace of the peeled linear substances, to thereby form a first electroconductive wire;

peeling off one or more of the linear substances, which is/are not neighboring the first electroconductive wire, and coating a second electroconductive substance onto the outside through a trace of the peeled linear substances, to thereby form a second electroconductive wire; and peeling off the remaining linear substances, and coating a second semiconductor onto the outside through a trace of the peeled linear substances.

A thirty-third embodiment resides in a production method of a columnar electric device, characterized in that the method comprises the steps of:

coating a first semiconductor onto an outer periphery of an insulative columnar body;

subsequently winding, onto an outside of the first semiconductor, a plate-like product obtained by mutually joining four or more semiconductor wires into a stripe shape;

thereafter peeling off one or more of the semiconductor wires, and coating a first electroconductive substance onto the outside through a trace of the peeled semiconductor wires, to thereby form a first electroconductive wire; and peeling off one or more of the semiconductor wires, which is/are not neighboring to the first electroconductive wire, and coating a second electroconductive substance onto the outside through a trace of the peeled semiconductor wires, to thereby form a second electroconductive wire.

A thirty-fourth embodiment resides in a production method of a columnar electric device, characterized in that the method comprises the steps of:

coating a first semiconductor onto an outer periphery of an insulative columnar body;

subsequently winding, onto an outside of the first semiconductor, a plate-like product obtained by mutually joining four or more electroconductive wires into a stripe shape;

thereafter peeling off two of the electroconductive wires, which are separated from each other by at least one of the electroconductive wires therebetween, and coating a second semiconductor onto the outside through traces of the peeled electroconductive wires.

A thirty-fifth embodiment resides in a production method of a columnar electric device, characterized in that the method comprises the steps of:

coating a first semiconductor onto an outer periphery of an insulative columnar body; and subsequently winding, onto an outside of the first semiconductor, a plate-like product obtained by mutually joining two electroconductive wires and two second semiconductor wires into a stripe shape in a staggered manner.

A thirty-sixth embodiment resides in a production method of a columnar electric device, characterized in that the method comprises the steps of:

coating a first semiconductor onto an outer periphery of an insulative columnar body;

subsequently winding, onto an outside of the first semiconductor, a plate-like product obtained by mutually connecting one first electroconductive wire comprising a first electroconductive substance and three semiconductor wires into a stripe shape; and thereafter peeling off the semiconductor wire, which is not neighboring to the first electroconductive wire, and coating a second electroconductive substance onto the outside through a trace of the peeled semiconductor wire, to thereby form a second electroconductive wire.

A thirty-seventh embodiment resides in the production method of a columnar electric device of any one of the thirty-first through thirty-sixth embodiments, characterized in that the columnar electric device is a sensor or solar cell.

A thirth-eighth embodiment resides in a columnar electric device, characterized in that the columnar electric device comprises:

an insulative columnar body;

a first semiconductor coated on an outer periphery of the insulative columnar body;

two electroconductive wires which are mutually parallel and helically wound around an outside of the first semiconductor; and a second semiconductor coated on the outside along each helical gap defined by the two electroconductive wires therebetween.

This electric device is produced by the method of any one of the thirty-first through thirty-sixth embodiments, for example.

A thirth-ninth embodiment resides in the columnar electric device of the thirty-eighth embodiment, characterized in that the columnar body is a fibrous body.

A fourtieth embodiment resides in a production method of a columnar electric device, characterized in that the method comprises the steps of:

coating a semiconductor onto an outer periphery of an electroconductive columnar body; and subsequently winding an electroconductive wire onto an outside of the semiconductor in a staggered manner.

A fourty-first embodiment resides in a production method of a columnar electric device, characterized in that the method comprises the steps of:

coating a semiconductor onto an outer periphery of an electroconductive columnar body;

subsequently coating a transparent electrode onto an outside of the semiconductor; and further winding an electroconductive wire onto an outside of the transparent electrode in a staggered manner.

A fourty-second embodiment resides in the production method of a columnar electric device of the fourtieth or forty-first embodiment, characterized in that the columnar electric device is an optical sensor or solar cell.

A forty-third embodiment resides in a columnar electric device, characterized in that the columnar electric device comprises:

an electroconductive columnar body;

a semiconductor coated around an outer periphery of the electroconductive columnar body; and an electroconductive wire helically wound around an outside of the semiconductor.

This electric device is produced by the method of any one of the fortiety through forty-second embodiments.

A forty-fourth embodiment resides in a production method of a columnar transistor, characterized in that the method comprises the steps of:

coating an insulating material onto an outer periphery of an electroconductive columnar body; and subsequently winding two electroconductive wires onto an outside of the insulating material.

A forty-fifth embodiment resides in the production method of a columnar transistor of the forty-fourth embodiment, characterized in that the method further comprises the steps of:

immersing the columnar transistor in a dopant solution; and achieving doping, while applying a voltage to the electroconductive columnar body or across the electroconductive wires.

A forty-sixth embodiment resides in a columnar transistor characterized in that the columnar transistor comprises:

an electroconductive columnar body;
an insulating material coated around an outer periphery of the electroconductive columnar body; and
two electroconductive wires which are mutually parallel and helically wound around an outside of the insulating material.

This columnar transistor is produced by the method of the forty-fourth or forty-fifth embodiment.

Effect of the Invention

According to the first embodiment, the mask material such as a fabric, thread, or the like is helically wound onto the outer periphery of the columnar body, and thereafter the electroconductive wire is wound onto the outer periphery by coating the electroconductive substance onto the outer periphery through the helical gap defined by the mask material. It is desirable to adopt vapor deposition, application, or the like as coating, thereby enabling obtainment of a stable columnar electric device having the electroconductive wire closely contacted with the columnar body.

According to the second through fourth embodiments, it becomes possible to arrange the electroconductive wire while uniformalizing a diameter of the electroconductive wire and a helical gap defined thereby, to facilitate a task of designing and simulation. Further, winding a linear substance having a small diameter like a thread, enables production of a small-sized columnar electric device.

The production method of the fifth embodiment is effective, when the electroconductive wire and the insulative wire exhibit a higher adhesiveness therebetween, for example, and readily follow a stress such as bending. It is desirable to use an epoxy adhesive for joining the electroconductive wire to the insulative wire and for joining them to the columnar body, and the columnar electric device can be produced by an extremely simple method.

According to the sixth embodiment, the columnar sensor or solar cell can be produced by the method of any one of the first through fifth embodiments.

The seventh embodiment resides in the columnar electric device which can be downsized. Examples thereof include a temperature sensor, pressure sensor, ion sensor, and the like. The mentioned sensors adopt platinum, poly-3-alkylthiophene, and polyaniline, as the electroconductive wires, respectively.

According to the eighth embodiment, also the columnar body can be downsized. It is desirable to adopt polyethylene terephthalate, polymethyl methacrylate, nylon, polyester, polypropylene, or the like, as the fibrous body. Simultaneously, according to the method of any one of the second through fifth embodiments, there can be obtained an extremely small-sized columnar electric device of 1 mm$^3$ or less, for example, by winding a thin electroconductive wire onto the columnar body with a fine interval to be defined by the electroconductive wire.

According to the ninth embodiment, the mask materials such as fabric, thread, or the like are helically wound onto the outside of the semiconductor coated on the columnar body, at first. Then, the electroconductive substances are coated onto the outside through the helical gaps defined by the mask materials, respectively, thereby winding the two electroconductive wires onto the outside. It is desirable to adopt vapor deposition, application, or the like as coating, thereby enabling obtainment of a stable columnar electric device having the two electroconductive wires closely contacted with the semiconductor.

According to the tenth through twelfth embodiments, it becomes possible to arrange the electroconductive wires while uniformalizing diameters of the electroconductive wires and helical gaps defined thereby, to facilitate a task of designing and simulation. Further, winding linear substances having small diameters like threads, enables production of a small-sized columnar electric device. In case of using the same material for both the first electroconductive wire and second electroconductive wire, it is desirable to produce the electric device by the method recited in the twelfth embodiment.

The production method of the thirteenth embodiment is effective, when the electroconductive wires and the insulative wires exhibit a higher adhesiveness therebetween, for example, and readily follow a stress such as bending. It is desirable to use an epoxy adhesive for joining the electroconductive wires to the insulative wires and for joining them to the columnar body, and the columnar electric device can be produced by an extremely simple method.

The production method of the fourteenth embodiment is effective, when the first electroconductive wire and the insulative wires exhibit a higher adhesiveness therebetween, for example, and readily follow a stress such as bending. It is desirable to use an epoxy adhesive for joining the first electroconductive wire to the insulative wires and for joining them to the columnar body, and the columnar electric device can be produced by an extremely simple method.

According to the fifteenth embodiment, the columnar sensor or solar cell can be produced by the method of any one of the ninth through fourteenth embodiments.

The sixteenth embodiment resides in a columnar electric device which can be downsized. Examples thereof include an optical sensor, gas sensor, humidity sensor, temperature sensor, radiation sensor, solar cell, and the like. The optical sensor is configured to use an organic semiconductor as the semiconductor, such as an electroconductive polymer, poly-p-phenylene, polythiophene, or the like doped with fullerene. Similarly, the gas sensor is configured to use poly-p-phenylene, polyacetylene, polythiophene, or the like; the humidity sensor, polyfuran, polythiophene, or the like; the temperature sensor, poly-3-alkylthiophene, or the like; and the radiation sensor, polyacetylene, polythiophene, or the like in a sulfur hexafluoride atmosphere. When the columnar optical sensor can be bent, it is also possible to immerse the portion of the optical sensor having the electroconductive wires wound thereon in a dopant solution, and to simultaneously apply a voltage to one of the electroconductive wires to thereby achieve doping.

The eighteenth embodiment resides in a columnar solar cell produced by the method of any one of the ninth through fourteenth embodiments. It is possible to obtain a small-sized solar cell, by a simple production method.

According to the seventeenth or nineteenth embodiment, also the columnar body can be downsized. The usable fibrous body is the same as that of embodiment 8. Simultaneously, according to the method of any one of embodiments 10 through 14, there can be obtained an extremely small-sized columnar electric device, by winding thin electroconductive wires with fine intervals to be defined by the electroconductive wires.

According to the twentieth embodiment, the mask materials such as fabric, thread, or the like are helically wound onto the outer periphery of the columnar body, at first. Then, the electroconductive substances are coated onto the outer periphery through the helical gaps defined by the mask materials, respectively, thereby winding the two electroconductive wires onto the outer periphery. Further, the semiconductor is coated onto the outer periphery through each helical gap defined by the two electroconductive wires therebetween. It is desirable to adopt vapor deposition, application, or the like as coating, thereby enabling obtainment of a stable columnar electric device having the two electroconductive wires and a semiconductor closely contacted with the columnar body.

According to the twenty-first through twenty-third embodiments, it becomes possible to arrange the electroconductive wires while uniformalizing diameters of the electroconductive wires and helical gaps defined thereby, to facilitate a task of designing and simulation. Further, winding linear substances having small diameters like threads, enables production of a small-sized columnar electric device. In case of using the same material for both the first electroconductive wire and second electroconductive wire, it is desirable to produce the electric device by the method recited in the twenty-third embodiment.

The production method of the twenty-fourth embodiment is effective, when the electroconductive wires and the semiconductor wires exhibit a higher adhesiveness therebetween, for example, and readily follow a stress such as bending. It is desirable to use an epoxy adhesive for joining the electroconductive wires to the semiconductor wires and for joining them to the columnar body, and the columnar electric device can be produced by an extremely simple method.

The production method of the twenty-fifth embodiment is effective, when the first electroconductive wire and the semiconductor wires exhibit a higher adhesiveness therebetween, for example, and readily follow a stress such as bending. It is desirable to use an epoxy adhesive for joining the first electroconductive wire to the semiconductor wires and for joining them to the columnar body, and the columnar electric device can be produced by an extremely simple method.

According to the twenty-sixth embodiment, the columnar sensor or solar cell can be produced by the method of any one of the twentieth through twenty-fifth embodiment.

The twenty-seventh embodiment resides in a columnar electric device which can be downsized. The contents thereof are the same as the sixteenth embodiment.

The twenty-ninth embodiment resides in a solar cell produced by the method of any one of the twentiety through twenty-fifth embodiments. It is possible to obtain a small-sized solar cell, by a simple production method.

According to the twenty-eighth or thirtieth embodiment, also the columnar body can be downsized. The usable fibrous body is the same as that of the eighth embodiment. Simultaneously, according to the method of any one of the twentieth through twenty-fifth embodiments, there can be obtained an extremely small-sized columnar electric device, by winding thin electroconductive wires and/or semiconductor wires with fine intervals to be defined by the electroconductive wires and/or semiconductor wires, respectively.

According to the thirty-first embodiment, the mask materials such as fabric, thread, or the like are helically wound onto the outside of the first semiconductor coated on the columnar body, at first. Then, the electroconductive substances are coated onto the outside through the helical gaps defined by the mask materials, respectively, thereby winding the two electroconductive wires onto the outside. Further, the second semiconductor is coated onto the outside through each helical gap defined by the two electroconductive wires therebetween. It is desirable to adopt vapor deposition, application, or the like as coating, thereby enabling obtainment of a stable columnar electric device having the two electroconductive wires and the second semiconductor closely contacted with the first semiconductor.

According to the thirty-second through thirty-fourth embodiments, it becomes possible to arrange the electroconductive wires while uniformalizing diameters of the electroconductive wires and helical gaps defined thereby, to facilitate a task of designing and simulation. Further, winding linear substances having small diameters like threads, enables production of a small-sized columnar electric device. In case of using the same material for both the first electroconductive wire and second electroconductive wire, it is desirable to produce the electric device by the method recited in the thirty-fourth embodiment.

The production method of the thirty-fifth embodiment is effective, when the electroconductive wires and the semiconductor wires exhibit a higher adhesiveness therebetween, for example, and readily follow a stress such as bending. It is desirable to use an epoxy adhesive for joining the electroconductive wires to the insulative wires and for joining them to the columnar body, and the columnar electric device can be produced by an extremely simple method.

The production method of the thirty-sixth embodiment is effective, when the first electroconductive wire and the semiconductor wires exhibit a higher adhesiveness therebetween, for example, and readily follow a stress such as bending. It is desirable to use an epoxy adhesive for joining the first electroconductive wire to the semiconductor wires and for joining them to the columnar body, and the columnar electric device can be produced by an extremely simple method.

According to the thirty-seventh embodiment, the columnar sensor or solar cell can be produced by the method of any one of the thirty-first through thirty-sixth embodiments.

The thirty-eighth embodiment resides in a columnar electric device which can be downsized. The contents thereof are the same as the sixteenth embodiment.

According to the thirty-ninth embodiment, also the columnar body can be downsized. The usable fibrous body is the same as that of the eighth embodiment, Simultaneously, according to the method of the thirty-first through thirty-sixth embodiments, for example, there can be obtained an extremely small-sized columnar electric device, by winding thin electroconductive wires and/or semiconductor wires with fine intervals to be defined by the electroconductive wires and/or semiconductor wires, respectively.

According to the fourtieth embodiment, the semiconductor is coated onto the outer periphery of the electroconductive columnar body, and then the electroconductive wire is wound onto the outside of the semiconductor. It is desirable to adopt vapor deposition, application, or the like as coating. It is desirable to adopt the method of any one of the first through fifth embodiments, for example, and the electroconductive columnar body and the electroconductive wire are closely contacted with each other through the semiconductor. This allows for production of a columnar electric device which operates stably.

According to the forty-first embodiment, the semiconductor is coated onto the outer periphery of the electroconductive columnar body, the transparent electrode is subsequently coated onto the outside of the semiconductor, and the electroconductive wire is further wound onto the outside of the transparent electrode. It is desirable to adopt vapor deposition, application, or the like as coating. It is desirable to adopt the method of any one of the first through fifth embodiments, for example, and the electroconductive columnar body and the electroconductive wire are closely contacted with each other through the semiconductor and the transparent electrode. Namely, even when the transparent electrode is partially cracked due to stress such as bending, the electroconductive wire fixes the transparent electrode while electrically contacting with the same. This allows for production of a columnar electric device which operates stably.

According to the forty-second embodiment, it becomes possible to produce a columnar optical sensor or solar cell which has an electroconductive columnar body, a semiconductor, and a transparent electrode, and which operates stably.

The forty-third embodiment resides in a columnar electric device which can be downsized.

According to the forty-fourth embodiment, the insulating material is coated onto the outer periphery of the electroconductive columnar body, and the two electroconductive wires are subsequently wound onto the outside of the insulating material. It is desirable to adopt vapor deposition, application, or the like as coating. It is desirable to adopt the method of any one of the ninth through fourteenth embodiments, and the electroconductive columnar body and the two electroconductive wires are closely contacted with each other through the insulating material. This allows for obtainment of a columnar electric device which operates stably.

According to the forty-fifth embodiment, it becomes possible to readily produce a transistor having the doped insulating material. When the columnar transistor produced by the method of the forty-fourth embodiment can be bent, the columnar transistor is bent and immersed into the dopant solution such that the portion of the transistor having the electroconductive wires wound thereon is immersed in the dopant solution. Further, there is applied a voltage to the electroconductive columnar body, for example, thereby achieving doping. It is also possible to observe a state of the doping, by causing electric current to flow between the two electroconductive wires. Namely, it is possible to perform the doping at an appropriate amount for the insulating material, while confirming the state of the doping.

The forty-sixth embodiment resides in a columnar transistor which can be downsized.

Figure 1:
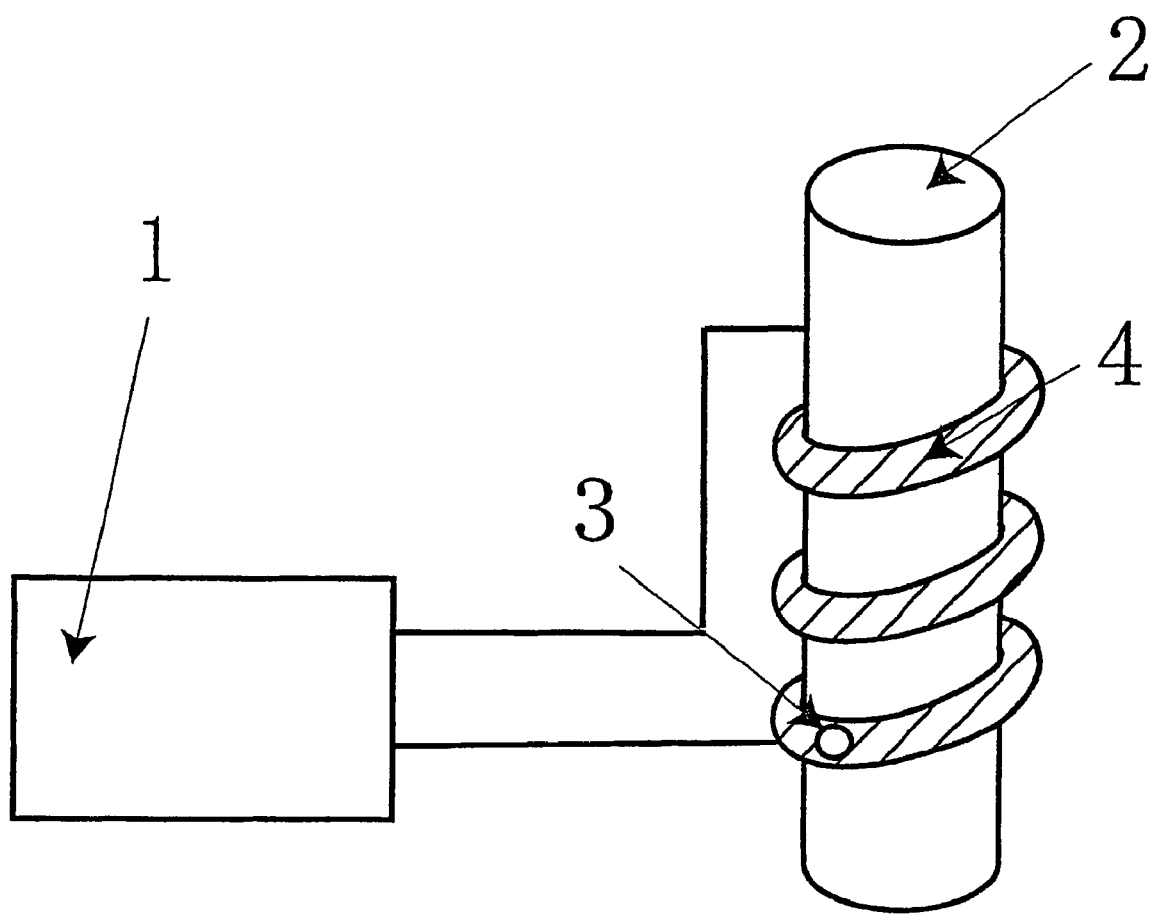
[FIG. 1] A perspective view of a temperature sensor as one type of "columnar electric device comprising a single wire" according to the present invention.

EXPLANATION OF REFERENCE NUMERALS 1 measuring instrument
2 insulative columnar body
3 tap
4 platinum wire
5 mask material
6 insulative wire
7 electroconductive wire
8 semiconductor
9 copper wire
10 aluminum wire
11 first electroconductive wire
12 second electroconductive wire
13 first semiconductor
14 second semiconductor
15 table
16 electroconductive columnar body
17 semiconductor
18 transparent electrode
19 electroconductive wire
20 electroconductive columnar body (gate electrode)
21 insulating material
22 electroconductive wire (source electrode, drain electrode)
23 dopant solution

BEST MODE FOR CARRYING OUT THE INVENTION

Meanings of terms according to the present invention will be clarified and the best mode of the present invention will be explained hereinafter.

"Columnar electric device" is an electric device in a columnar shape such as a circular column, polygonal column, or the like. Examples thereof include a columnar sensor, solar cell, and the like.

"Columnar body" is a substrate having an outer periphery around which electroconductive wire(s), semiconductor wire(s), or the like is/are wound to fabricate a columnar electric device such as a sensor, solar cell, or the like. The present invention utilizes both electroconductive and insulative ones. Particularly, examples of insulative materials include plastics, quartz, sapphire, and the like. In producing a small-sized columnar electric device, it is preferable to use a fibrous body of polyethylene terephthalate, polymethyl methacrylate, nylon, polyester, polypropylene, or the like. Adopting a fibrous body enables a columnar body to have a diameter of 0.1 to 1.0 mm, and enables production of an extremely small-sized sensor, solar cell, or the like.

"Coating" is to coat an electroconductive wire, semiconductor wire, or the like around an outer periphery of a columnar body. As an example, coating is performed by vapor deposition of a substance to be coated, or application of a substance to be coated in a melt, solution, or gel state.

"Mask material" is provided to cover a part of a side surface of a columnar body when an electroconductive wire(s), semiconductor wire(s), or the like is/are coated onto an outer periphery of the columnar body such that an unintended zone of the columnar body is not coated. As an example, it is desirable to adopt a fabric, thread, aluminum foil, copper foil, paper, the same material as the columnar body, or the like.

(Columnar Electric Device Comprising Single Wire)

FIG. 1 is a perspective view of a temperature sensor as one type of "columnar electric device comprising a single wire" according to the present invention. Wound around an outer periphery of an insulative columnar body 2 made of plastics, for example, is a platinum wire 4. The platinum wire 4 has opposite sides having taps 3 mounted thereon, respectively, which are connected to a measuring instrument 1 to measure a resistance value to enable recognition of temperature.

Figure 2:
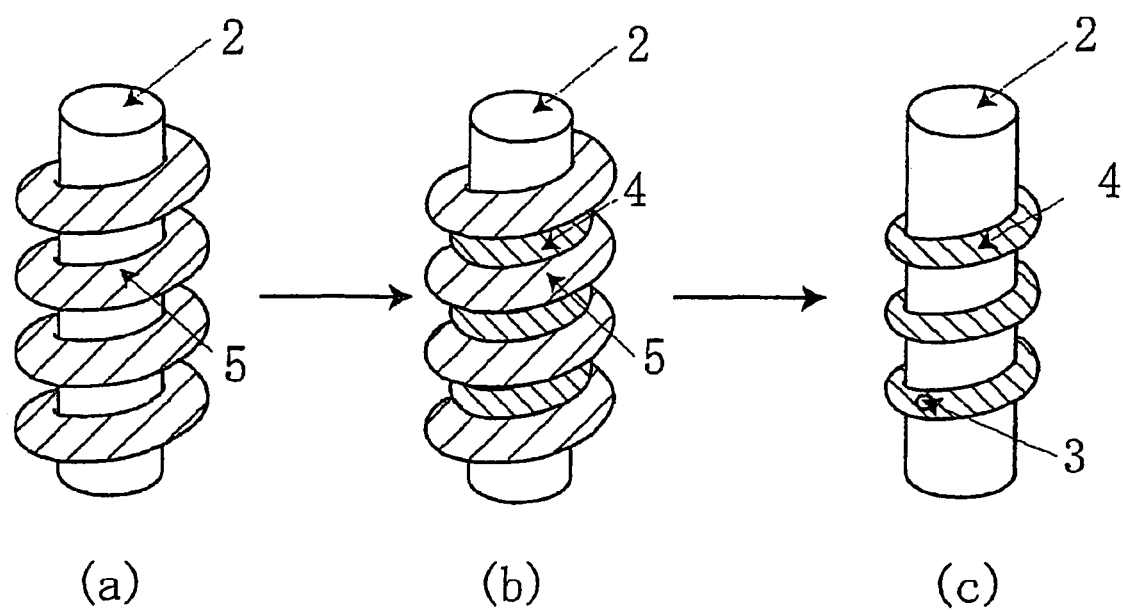
[FIG. 2] A schematic view of a typical production method of the "columnar electric device comprising a single wire".

FIG. 2 shows a method for fabricating a temperature sensor by a vapor deposition method. Firstly, as shown in (a), there is helically wound a coating-oriented mask material 5 around an outer periphery of an insulative columnar body 2, and fixed thereto. Further, as shown in (b), platinum is coated onto the outer periphery such as by vapor deposition through a helical gap defined by the fabric 5, thereby forming a platinum wire 4. When the adopted mask material 5 was electroconductive, the mask material 5 is removed as shown in (c). Then, taps 3 are mounted to opposite sides of the platinum wire 4, respectively, for completion. For example, it is desirable to adopt a fabric, thread, aluminum foil, copper foil, paper, or the like, as the mask material 5.

Figure 3:
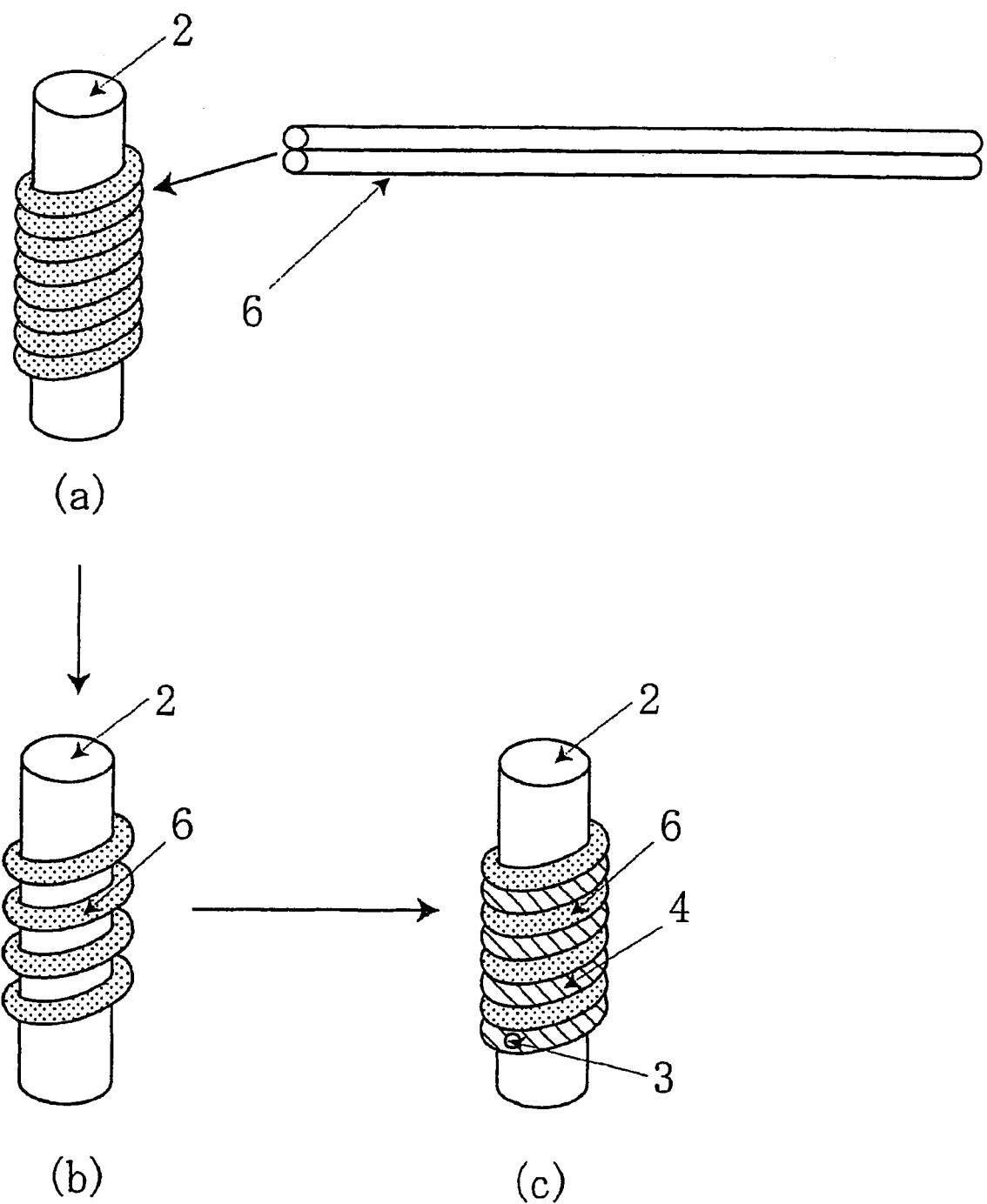
[FIG. 3] A schematic view of an example of a production method of a "columnar electric device comprising a single wire" having a uniformly wound electroconductive wire.

FIG. 3 shows another method for uniformly winding a platinum wire by a vapor deposition method. For example, there is prepared a plate-like product provided by mutually joining two insulative wires 6 into a stripe shape. This is wound onto an outer periphery of an insulative columnar body 2, and fixed thereto by an adhesive or the like as shown in (a). Next, one of the insulative wires 6 is peeled off, as shown in (b). For example, it is sufficient to pinch one end of the applicable insulative wire 6 by hand, tweezers or the like, and to peel it along an outer periphery of the columnar body 2. Finally, platinum is vapor deposited onto the outer periphery through the trace as shown in (c), thereby forming a platinum wire 4. Then, taps 3 are mounted to opposite sides of the platinum wire 4, respectively, for completion.

The insulative wires 6 for constituting the plate-like product are not limited to two in number. For example, it is possible to wind, a plate-like product obtained by mutually joining three insulative wires 6 into a stripe shape, onto an outer periphery of a columnar body 2, and then to peel off two of the insulative wires 6 so that platinum is vapor deposited onto the outer periphery through the traces.

It is possible to prepare the plate-like product by a linear substance other than the insulative wire 6. In case of adopting an electroconductive linear substance, the linear substance left on the outer periphery of the columnar body 2 is to be peeled off after finishing vapor deposition of platinum in (c).

Adoption of the vapor deposition method shown in FIG. 3 enables the platinum wire 4 to be adjusted in diameter and in helical gap, and to be uniformly wound. Further, adoption of a linear substance such as a thread enables the platinum wire 4 to be thin in diameter and to define a narrower helical gap. This allows for fabrication of a small-sized temperature sensor.

Instead of an insulative wire 6, it is possible to wind an electroconductive wire such as a plate-like product obtained by mutually joining platinum wires into a stripe shape, onto an outer periphery of a columnar body 2. The plate-like product comprising a plurality of platinum wires is densely wound onto an outer periphery of the columnar body 2, and fixed thereto by a two-part epoxy adhesive, for example. In considering heat resistance, it is desirable to attain the fixation by adopting a ceramic adhesive such as Sauereisen Cement of Nilaco Corporation. Next, there is pinched one end of one(s) of the platinum wires by hand, tweezers, or the like, and the applicable one(s) is/are peeled off along the outer periphery of the columnar body 2. Then, taps are mounted to both sides of the platinum wire(s) fixed on the outer periphery of the columnar body 2, respectively, for completion. In this case, it is possible to omit a process of coating such as vapor deposition.

The fixing of the plate-like product comprising the plurality of platinum wires onto the outer periphery of the columnar body 2, may be performed by heating at 130° C., for example.

Figure 11:
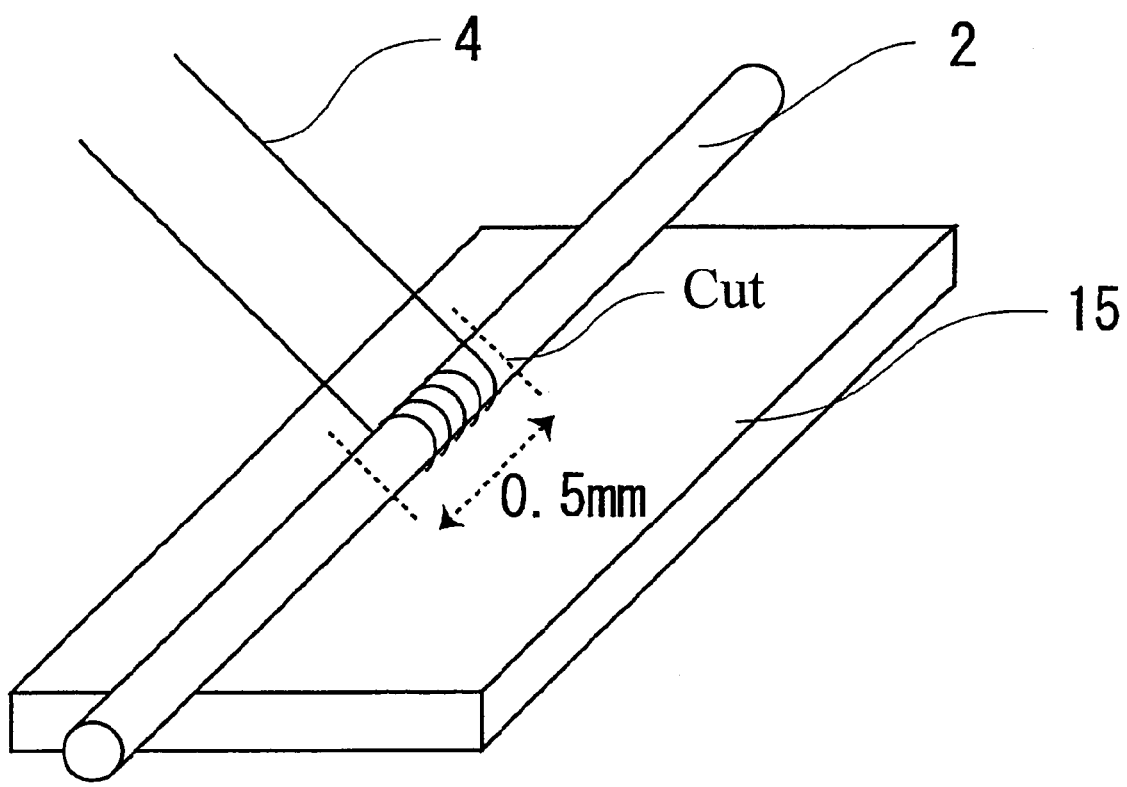
[FIG. 11] A perspective view of an example of a production method of a small-sized temperature sensor.

It is possible to downsize both an insulative columnar body and a platinum wire, by adopting: a fibrous body such as polyethylene terephthalate, polymethyl methacrylate, nylon, polyester, polypropylene, or the like as the columnar body; and a platinum wire having a diameter of 0.02 mm. For example, this exemplarily allows for production of a temperature sensor of 1 mm$^3$ or less. FIG. 11 is a perspective view showing an example of a production method of the temperature sensor. This was provided by densely winding two platinum wires 4 each having a diameter of 0.02 mm onto a part of a columnar body made of a fibrous body, and by peeling off one of the platinum wires. The resultant product is to be exemplarily placed on a table 15 to cut opposite ends of the columnar body having the platinum wire wound thereon, thereby producing an extremely small-sized sensor. Adopting this temperature sensor allows for the same to be set in a narrow space to measure a temperature there.

Examples of electroconductive wires to be wound on the outer periphery of the columnar body 2 include those other than metal, such as organic electroconductive wires, for example. In this case, coating may be performed by application of an organic electric conductor in a melt, solution, or gel state, instead of vapor deposition at (c).

As an example, there exist a pressure sensor adopting poly-3-alkylthiophene as an organic electric conductor, an ion sensor adopting ponyaniline, and the like. It is desirable to apply an organic electric conductor dissolved in a coating-material aimed solvent, such as a toluene or xylene solution, onto the outer periphery of the columnar body 2. Only, it is required to adopt a columnar body 2 and a mask material, which are insoluble in the coating-material aimed solvent. The former pressure sensor is largely changed in electrical conductivity by a change of pressure, even at a lower pressure. The latter ion sensor is configured to detect a pH value of an aqueous solution, by measuring a voldammogram of ponyaniline immersed in the aqueous solution.

Figure 4:
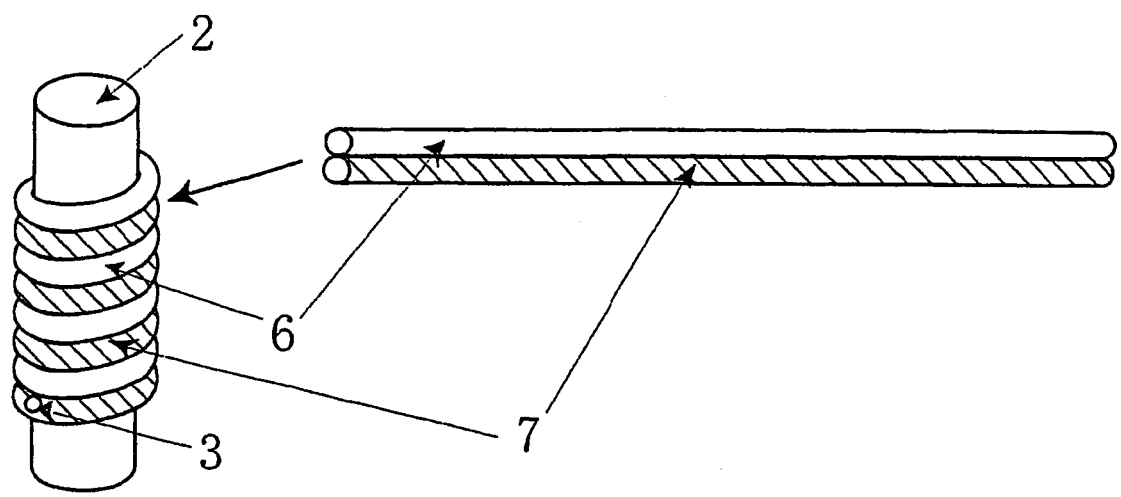
[FIG. 4] A schematic view of another example of a production method of a "columnar electric device comprising a single wire" having a uniformly wound electroconductive wire.

It is possible to fabricate a sensor by a method shown in FIG. 4, insofar as an electroconductive wire and an insulative wire exhibit a higher bonding force therebetween, and the plate-like product obtained by mutually bonding them is capable of readily following a bending stress. Namely, the plate-like product obtained by mutually joining an insulative wire 6 and an electroconductive wire 7 into a stripe shape, is wound onto an outer periphery of a columnar body 2, and is fixed thereto by an adhesive or the like. Also in this case, it is possible to omit a process of coating such as vapor deposition, and taps 3 are mounted to opposite sides of the electroconductive wire 7, respectively, for completion.

(Columnar Electric Device Comprising Plate-Like Semiconductor)

Figure 5:
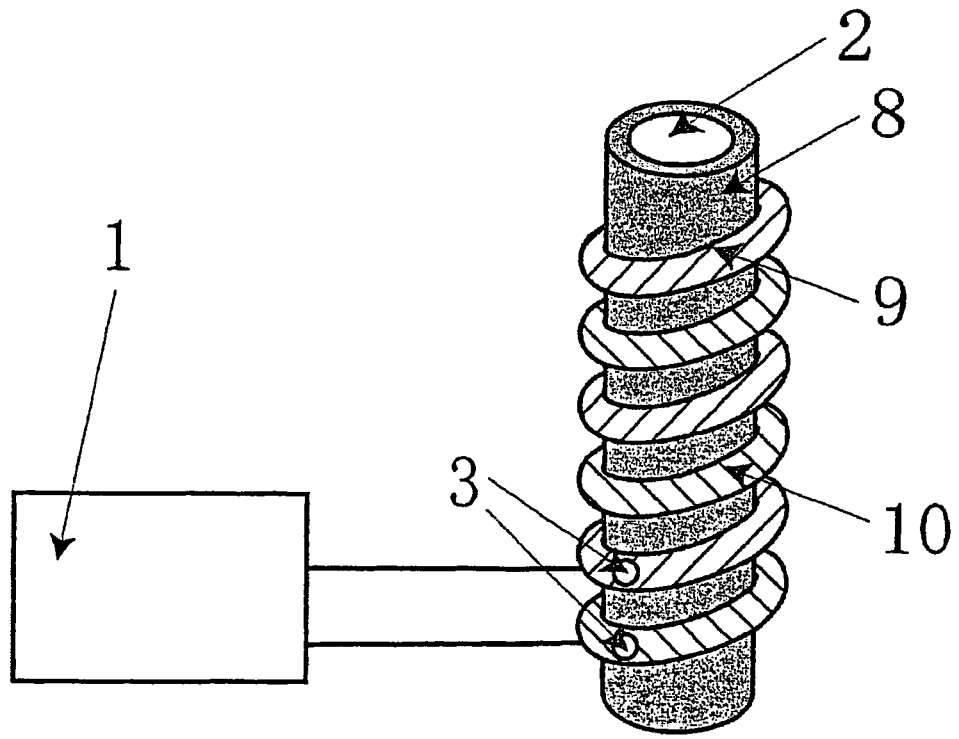
[FIG. 5] A perspective view of an optical sensor as one type of "columnar electric device comprising a plate-like semiconductor" according to the present invention.

FIG. 5 is a perspective view of an optical sensor as one type of "columnar electric device comprising a plate-like semiconductor" according to the present invention. Coated in a plate shape around an outer periphery of an insulative columnar body 2, is a semiconductor 8, such as an organic semiconductor comprising electroconductive polymer doped with fullerene, for example. Additionally wound onto an outside thereof are a copper wire 9 and an aluminum wire 10. Light irradiated to the sensor is converted into electricity by the semiconductor 8. It is possible to know an intensity of light irradiated to the sensor, by measuring an electric current flowing between the copper wire 9 and aluminum wire 10 by a measuring instrument 1.

As the electroconductive polymer, it is possible to adopt poly-3-alkylthiophene, poly-2,5-dioxythyroxy-p-phenylenevinylene, and the like. In case of adoption of poly-3-hexylthiophene as one kind of poly-3-alkylthiophene, it is desirable to previously dope 20 to 30 wt % of fullerene.

When the columnar optical sensor can be bent, it is also possible to immerse the portion having the electroconductive wires wound thereon in a dopant solution, and to simultaneously apply a voltage to one of the electroconductive wires to thereby achieve doping. Namely, it is also possible to perform suitable doping by a simple method.

Further, there is improved an efficiency of photoelectric conversion by adopting a combination of gold wire (5.2 eV)-aluminum wire (4.3 eV) having a larger difference between work functions thereof, instead of a combination of copper wire 9-aluminum wire 10. This also allows for utilization as a solar cell.

Coating of an outer periphery of a columnar body 2 by a semiconductor 8 is achieved by vapor depositing the semiconductor 8 thereto. Alternatively, coating is performed by application of the semiconductor 8 in a melt, solution, or gel state, onto the columnar body 2. For example, it is desirable to apply a semiconductor dissolved in a coating-material aimed solvent, such as a toluene or xylene solution, onto the outer periphery of the columnar body 2. Only, it is required to adopt a columnar body 2 which is insoluble in the coating-material aimed solvent.

The winding of the copper wire 9 and aluminum wire 10 onto an outside of the columnar body can be achieved by the same method as that explained in FIG. 2. The mask material for coating, such as a fabric 5, is helically wound and fixed thereto. In this state, copper is coated such as by vapor deposition, to form a copper wire 9 through a helical gap defined by the fabric 5. The fabric 5 wound for formation of the copper wire 9 is removed, and then another fabric 5 is helically wound to cover the copper wire 9 and is fixed. This is followed by vapor deposition of aluminum, to form an aluminum wire 10 through a helical gap defined by the fabric 5. The fabric 5 wound for formation of the aluminum wire 10 is removed, and then taps 3 are finally mounted to the copper wire 9 and aluminum wire 10, respectively, for completion.

Figure 6:
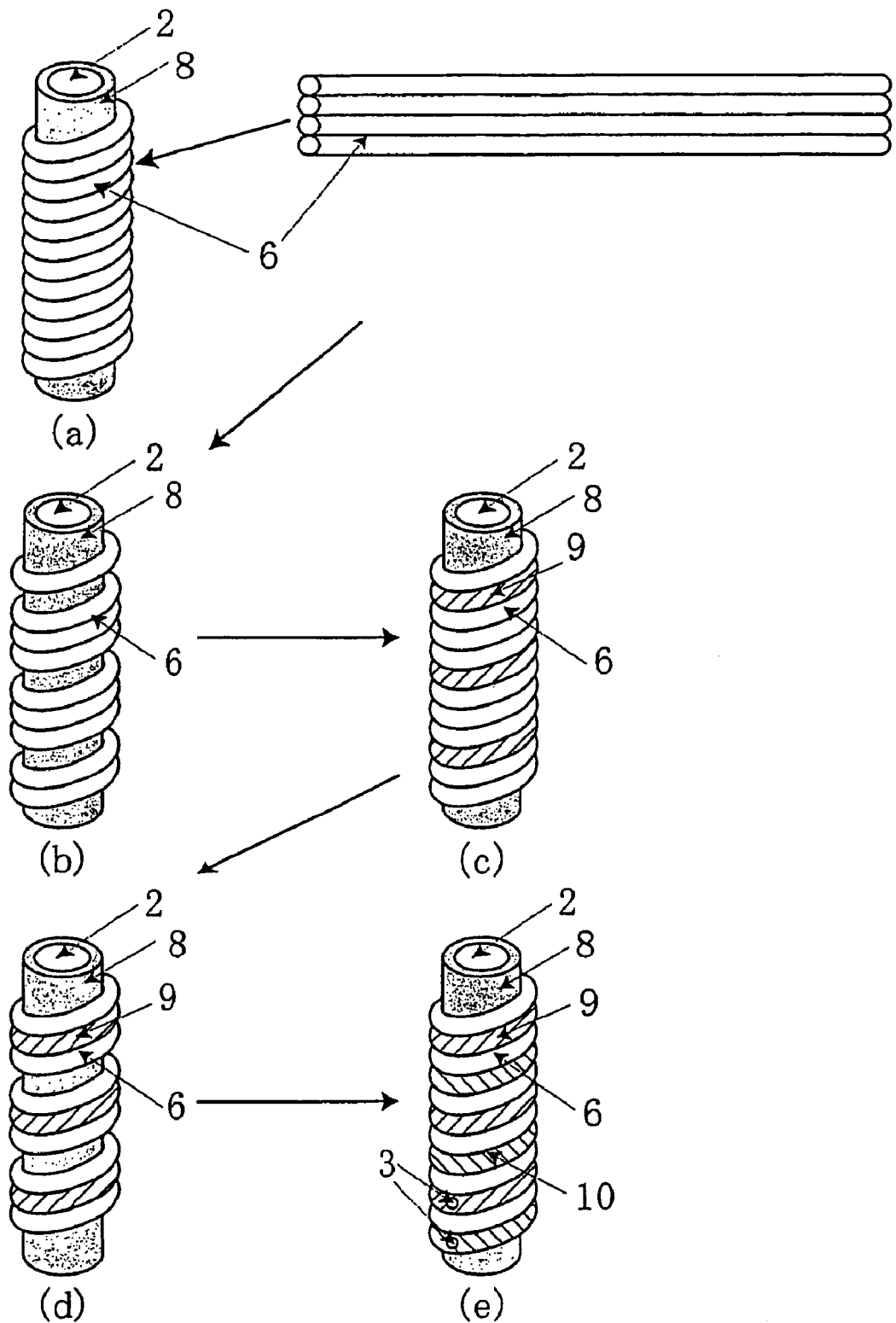
[FIG. 6] A schematic view of an example of a production method of a "columnar electric device comprising a plate-like semiconductor" having uniformly wound electroconductive wires.

In uniformly winding the copper wire 9 and aluminum wire 10, it is desirable to adopt a method shown in FIG. 6. Firstly, as shown in (a), there is prepared a plate-like product obtained by mutually joining four insulative wires 6 into a stripe shape, for example. After coating a semiconductor 8 onto an outer periphery of a columnar body 2, the plate-like product is wound onto an outside of the semiconductor and fixed thereto. Next, as shown in (b) and (c), one of the four insulative wires 6 is peeled off, and copper is vapor deposited onto the outside through a trace of the peeled insulative wire to thereby form a copper wire 9. Thereafter, as shown in (d) and (e), one of the insulative wires 6, which is not neighboring to the vapor deposited copper wire 9, is peeled off, and aluminum is vapor deposited onto the outside through a trace of the peeled insulative wire to thereby form an aluminum wire 10. Finally, taps 3 are mounted to the copper wire 9 and aluminum wire 10, respectively, for completion.

The insulative wires 6 constituting the plate-like product is not limited to four in number. It is also possible to wind a plate-like product obtained by mutually joining four or more insulative wires 6 into a stripe shape, onto a columnar body 2. Thereafter, one or more of the insulative wires 6 is/are peeled off, and copper at a trace(s) of the peeled wire(s) is vapor deposited onto the outer periphery of the columnar body to form a copper wire 9. Next, one or more of the insulative wires 6, which is/are not neighboring to the copper wire 9, is/are peeled off, and aluminum is vapor deposited onto the outer periphery through a trace(s) of the peeled wire(s) to form an aluminum wire 10. This is also applicable to a "columnar electric device comprising a semiconductor wire" and a "columnar electric device using two kinds of semiconductors".

It is possible to prepare the plate-like product by linear substances other than the insulative wires 6. In case of adopting electroconductive linear substances, the linear substance left on the outer periphery of the semiconductor 8 is to be peeled off after omitting vapor deposition of platinum in (e).

Adoption of the vapor deposition method shown in FIG. 6 enables the copper wire 9 and aluminum wire 10 to be each adjusted in diameter and in helical gap, and to be uniformly wound. Further, adoption of threads as the insulative wires 6 enables the copper wire 9 and aluminum wire 10 to be each thin in diameter and to define a narrower helical gap. This allows for fabrication of a small-sized optical sensor.

In case of production of a columnar electric device by two electroconductive wires of the same material, it is also possible to wind a plate-like product obtained by mutually joining a plurality of electroconductive wires into a stripe shape, instead of insulative wires 6, onto an outside of a semiconductor 8. The plate-like product comprising the plurality of electroconductive wires are wound onto an outer surface of the semiconductor 8, and fixed thereto. Subsequently, there are peeled off two of the electroconductive wires, which are separated from each other by at least one of the electroconductive wires therebetween. Finally, taps are mounted to the two electroconductive wires joined to the outer surface of the semiconductor 8, respectively, for completion. In this case, it is possible to omit a process of coating of electroconductive wires, such as vapor deposition.

Examples of the two electroconductive wires to be wound on the outside of the columnar body 2 coated with the semiconductor 8 include those other than metal, such as organic electroconductive wires. In this case, coating may be performed by application of an organic electric conductor in a melt, solution, or gel state, instead of vapor deposition at (c) and (e).

Figure 7:
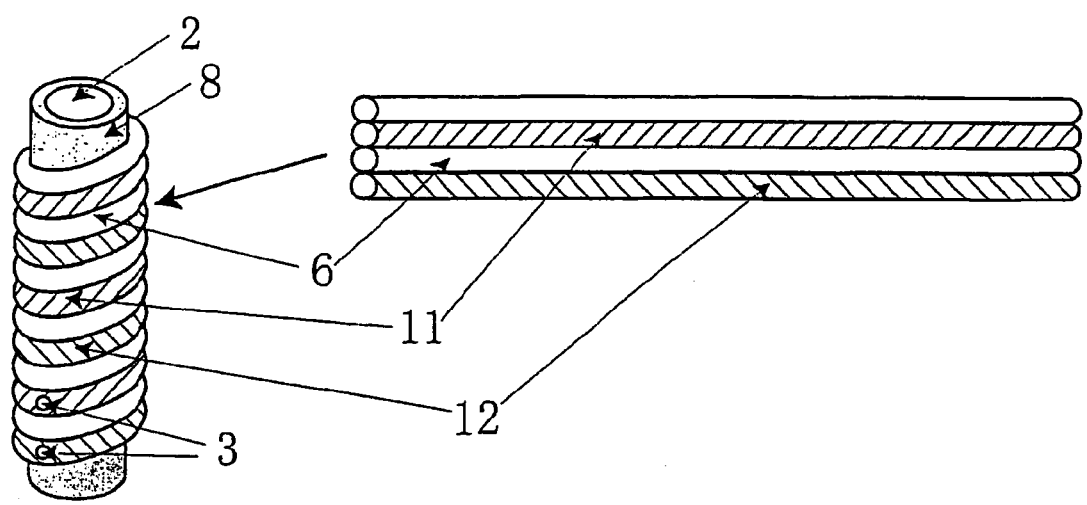
[FIG. 7] A schematic view of another example of a production method of a "columnar electric device comprising a plate-like semiconductor" having uniformly wound electroconductive wires.

It is possible to fabricate a columnar electric device by a method shown in FIG. 7, insofar as two electroconductive wires and insulative wires exhibit higher bonding forces therebetween, and the plate-like product obtained by mutually bonding them is capable of readily following a bending stress. Namely, there is prepared a combination of an insulative wire 6, a first electroconductive wire 11, an insulative wire 6, and a second electroconductive wire 12 joined into a stripe shape.

This is wound onto an outside of the columnar body 2 coated with the semiconductor 8. Also in this case, it is possible to omit a process of coating of electroconductive wires such as vapor deposition, and taps 3 are mounted to the first electroconductive wire 11 and second electroconductive wire 12, respectively, for completion.

Figure 8:
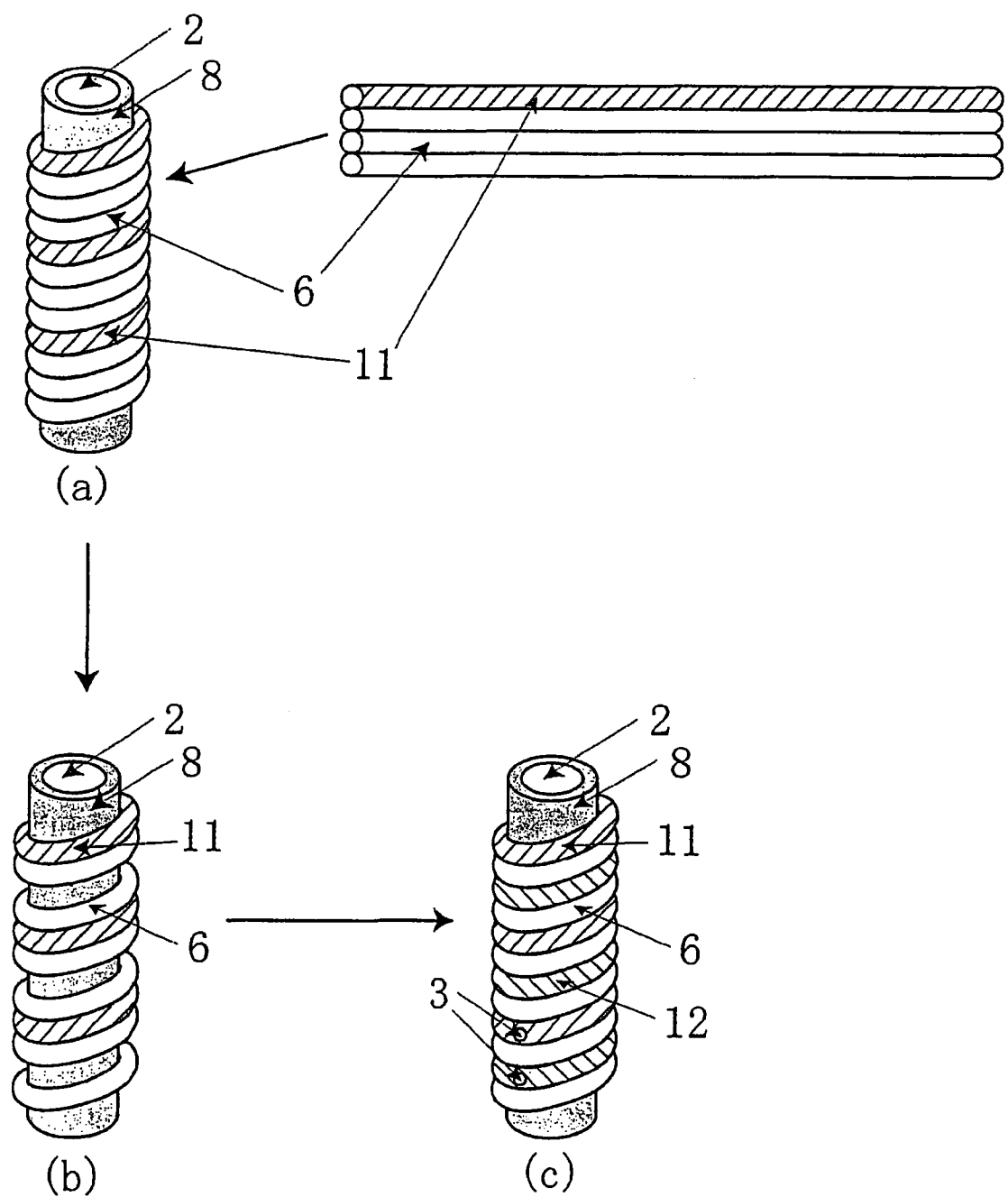
[FIG. 8] A schematic view of still another example of a production method of a "columnar electric device comprising a plate-like semiconductor" having uniformly wound electroconductive wires.

FIG. 8 shows another fabrication method. This is to fabricate one of two electroconductive wires by winding, and the other by vapor deposition. Firstly, as shown in (a), there is prepared a plate-like product obtained by mutually joining one first electroconductive wire 11 and three insulative wires 6 into a stripe shape. After coating a semiconductor 8 onto an outer periphery of a columnar body 2, the plate-like product is wound onto an outside of the semiconductor and fixed thereto. As shown in (b) and (c), there is peeled one insulative wire 6 which is not neighboring to the first electroconductive wire 11, and there is vapor deposited a second electroconductive substance onto the outer periphery through a trace of the peeled wire to thereby form a second electroconductive wire 12. Finally, taps 3 are mounted to the first electroconductive wire 11 and second electroconductive wire 12, respectively, for completion.

Examples of a "columnar electric device comprising a plate-like semiconductor and two electroconductive wires" to which the present invention is applicable, include the following sensors, in addition to the above optical sensor.

There exist gas sensors utilizing poly-p-phenylene, polyacetylene, polythiophene, or the like, as a semiconductor 8. These semiconductors are each changed in electrical conductivity, by contact with nitrogen monoxide (NO) gas, ammonia ($NH_3$) gas, or the like. The gas concentration is measured by a change of electrical conductivity.

Also, there exist sensors utilizing polyfuran, polythiophene, or the like as a semiconductor 8. There is measured a humidity, by a change of electrical conductivity in case of polyfuran, and by a change of electric potential between two electroconductive wires contacted with the semiconductor made of polythiophene.

There exist temperature sensors utilizing poly-3-alkylthiophene or the like as a semiconductor 8. Poly-3-alkylthiophene is melted by heating, and there are largely changed an electrical conductivity, optical spectrum, and the like as precursory phenomena of melting. These are utilized.

There exist optical sensors utilizing poly-p-phenylene, polythiophene, and the like as a semiconductor 8. The poly-p-phenylene is to utilize a light induced isomerization reaction (transformation between quinoid structure and benzenoid structure due to light). Polythiophene causes light induced doping, by making the same to carry a substance such as photodissociative triphenyl iodonium tetrafluoroborate or the like. Polythiophene is capable of constituting a sensor utilizing such light induced doping.

Additionally, there exist radiation sensors utilizing polyacetylene or polythiophene in a sulfur hexafluoride ($SF_6$) atmosphere. This is to utilize a fact that an electrical conductivity is notably changed when an electron beam is irradiated to the induced semiconductor in an $SF_6$ atmosphere.

It is possible to produce an extremely small-sized columnar electric device, also by the "columnar electric device comprising a plate-like semiconductor". For example, there is adopted a fibrous body such as polyethylene terephthalate or the like, as a columnar body 2. There is coated, onto an outer periphery thereof, a semiconductor 8 comprising organic compound at a thickness of 50 to 500 µm. To be densely wound onto an outside of the semiconductor is an electroconductive wire of 0.05 to 1 mm in diameter, thereby enabling obtainment of an extremely small-sized columnar electric device.

(Columnar Electric Device Comprising Semiconductor Wire)

Figure 9:
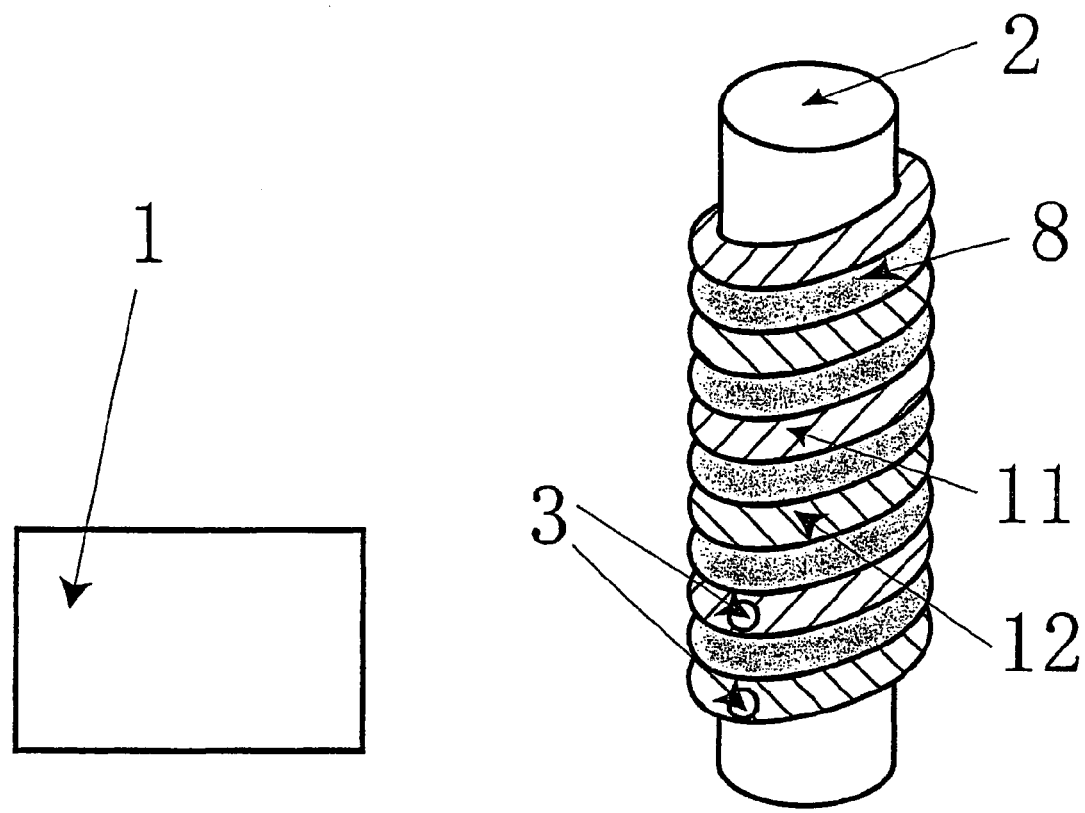
[FIG. 9] A perspective view of a "columnar electric device comprising a semiconductor wire" according to the present invention.

FIG. 9 is a perspective view of an "organic electric device comprising a semiconductor wire" according to the present invention. This is provided by winding a first electroconductive wire 11 and a second electroconductive wire 12 around an insulative columnar body 2, and by coating semiconductors 8 between the two electroconductive wires, respectively.

It is possible to adopt the same winding manner of the two electroconductive wires, as that explained in the "columnar electric device comprising a plate-like semiconductor". In case of winding the two electroconductive wires by utilizing linear substances, the two electroconductive wires are wound in the same manner as the above described columnar electric device. Thereafter, it is desirable to peel off the remaining linear substances, and to coat the semiconductors 8 onto the outer periphery through the traces of the peeled substances. It is also possible to perform the coating of the semiconductors 8, by various methods including vapor deposition, or application of a semiconductor in a melt, solution, or gel state.

It is possible to perform fabrication by the following method, insofar as two electroconductive wires and semiconductor wires exhibit higher bonding forces therebetween, and the plate-like product obtained by mutually bonding them is capable of readily following a bending stress. There is prepared a plate-like product to be obtained by mutually joining four wires in an order of a semiconductor wire, a first electroconductive wire, a semiconductor wire, and a second electroconductive wire into a stripe shape. This is wound onto an outer periphery of a columnar body and fixed thereto, followed by mounting of taps to the first electroconductive wire and second electroconductive wire, respectively, for completion.

It is further possible to prepare a plate-like product obtained by mutually joining a first electroconductive wire and three semiconductor wires into a stripe shape. This plate-like product is wound onto an outer periphery of a columnar body, and fixed thereto. Thereafter, there is peeled off the semiconductor wire which is not neighboring to the first electroconductive wire, and there is coated a second electroconductive substance onto the outer periphery through the trace to thereby form a second electroconductive wire. Finally, taps are mounted to the first electroconductive wire and second electroconductive wire, respectively, for completion.

The various sensors and solar cells explained in the "columnar electric device comprising a plate-like semiconductor" are also applicable here.

(Columnar Electric Device using Two Kinds of Semiconductors)

Figure 10:
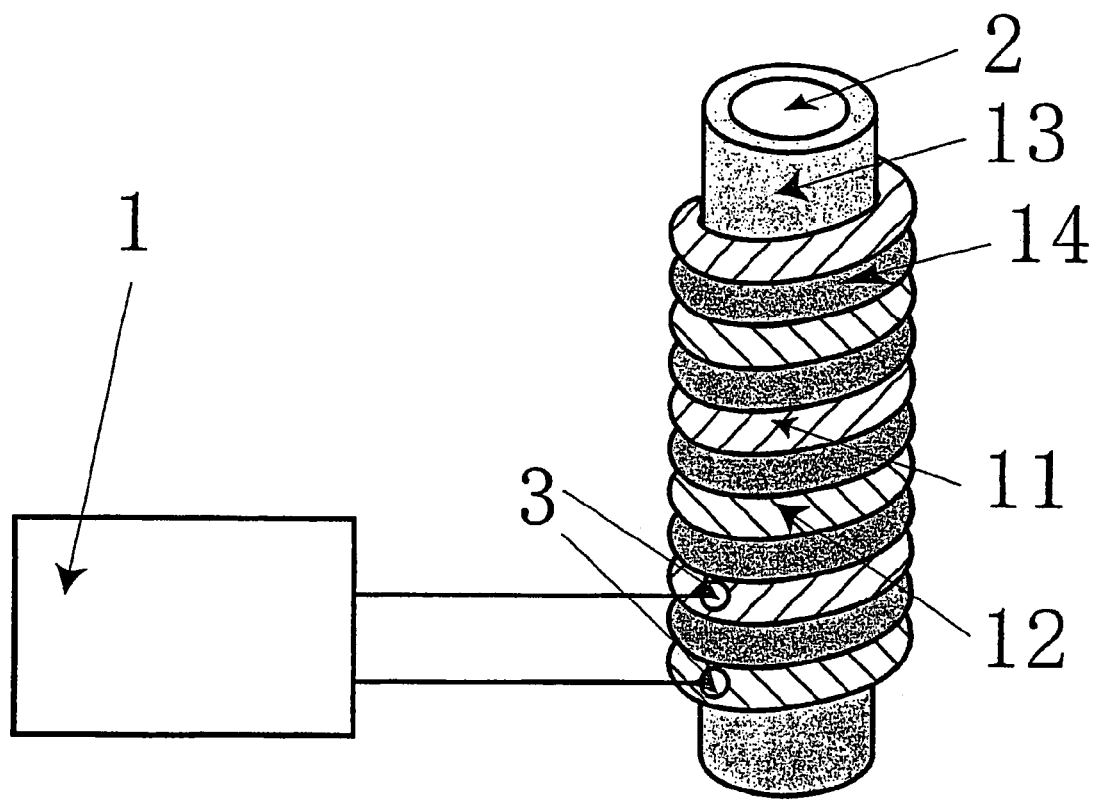
[FIG. 10] A perspective view of a "columnar electric device using two kinds of semiconductors" according to the present invention.

FIG. 10 is a perspective view of a "columnar electric device using two kinds of semiconductors" according to the present invention. After coating a first semiconductor 13 onto an outer periphery of an insulative columnar body 2, there are wound a first electroconductive wire 11 and a second electroconductive wire 12 onto an outside of the first semiconductor. Further, there are coated second semiconductors 14 between the two electroconductive wires. For the winding of the electroconductive wires 11 and 12 and the coating of the second semiconductors 14, it is possible to use the same method as that explained in the "columnar electric device comprising a plate-like semiconductor" and the "columnar electric device comprising a semiconductor wire". Further, since it is possible to use two kinds of semiconductors here, the usage of sensors according to the present invention can be increased, such as an increased number of kinds of detectable gases.

The various sensors explained in the "columnar electric device comprising a plate-like semiconductor" are also applicable here.

(Columnar Electric Device Having Electroconductive Columnar Body)

Figure 12:
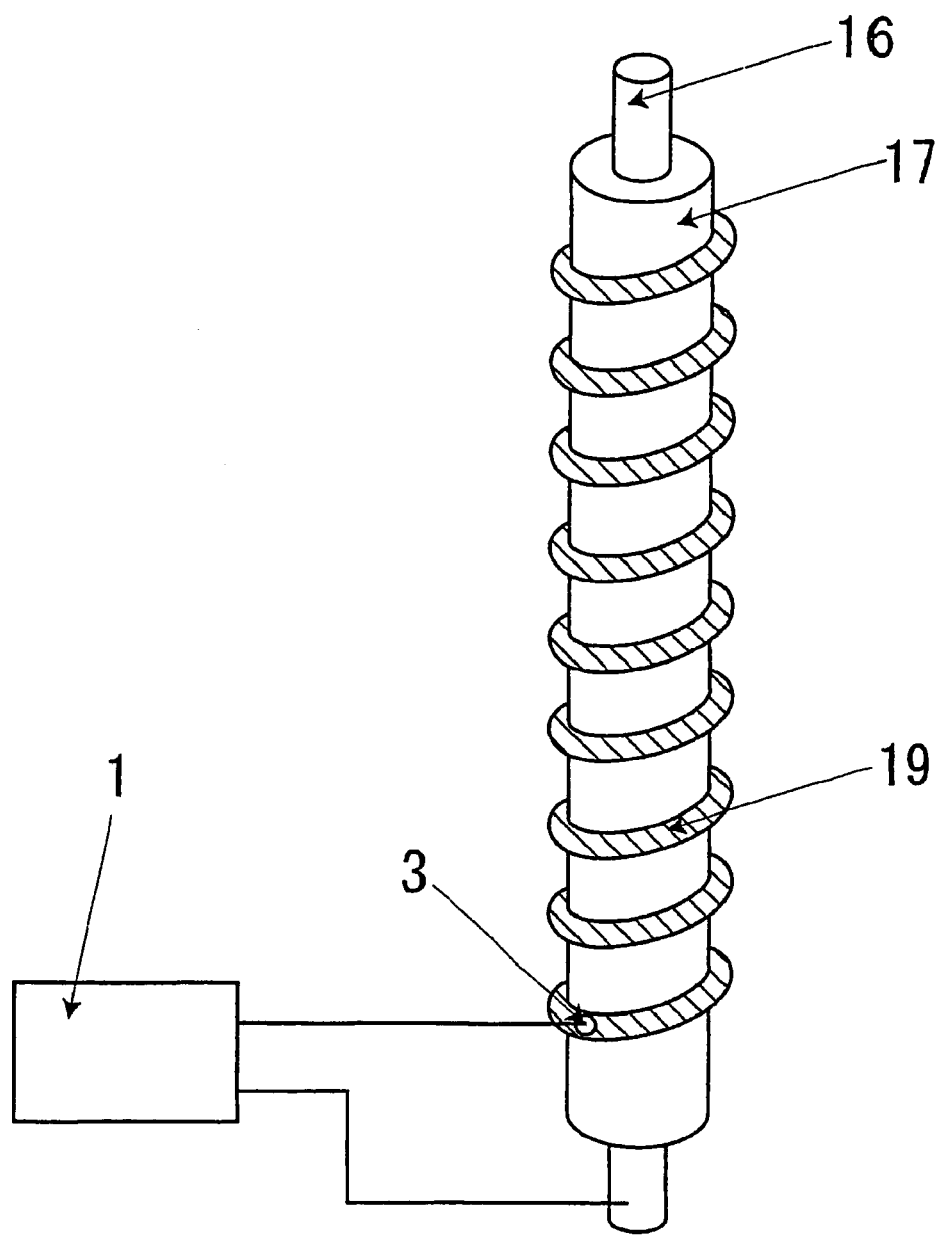
[FIG. 12] A perspective view of an optical sensor as an embodiment of a "columnar electric device having an electroconductive columnar body" according to the present invention.

FIG. 12 is a perspective view of an optical sensor as an embodiment of a "columnar electric device having an electroconductive columnar body" according to the present invention. Coated on an outer periphery of an electroconductive columnar body 16 is a semiconductor 17. Wound around an outside thereof is an electroconductive wire 19.

The electroconductive columnar body 16 is made of aluminum, for example.

The semiconductor 17 is coated onto an outer periphery of the electroconductive columnar body 16. The semiconductor 17 is made of an electroconductive polymer doped with fullerene, for example. As the electroconductive polymer, it is possible to adopt poly-3-alkylthiophene, poly-2,5-dioxythyroxy-p-phenylenevinylene, and the like. In case of adoption of poly-3-hexylthiophene as one kind of poly-3-alkylthiophene, it is desirable to previously dope 20 to 30 wt % of fullerene. The coating of the semiconductor 17 is performed by vapor deposition, or application of a semiconductor in a melt, solution, or gel state.

There is wound an electroconductive wire 19 such as a copper wire, onto an outside of the semiconductor 17. It is desirable to perform the winding of the electroconductive wire 19 in the same manner as the winding of the platinum wire explained in the "columnar electric device comprising a single wire". After winding the electroconductive wire 19, a tap 3 is mounted to the electroconductive wire 19 for completion.

Production in the above manner constitutes an optical sensor. The electroconductive columnar body 16 made of aluminum is different from the electroconductive wire 19 made of a copper wire in work function, so that there is generated an electric potential difference between the columnar body 16 and electroconductive wire 19 upon irradiation of light to the semiconductor 17. Measuring the electric potential difference by a measuring instrument, allows for measurement of an intensity of light irradiated to the semiconductor 17 through a helical gap defined by the electroconductive wire 19, for example.

The optical sensor shown in FIG. 12 can also be utilized as a solar cell. Further, adoption of a gold wire instead of the copper wire as the electroconductive body wire 19 enables an efficiency of photoelectric conversion to be improved.

As the semiconductor 17, it is desirable to adopt an organic compound such as the above described electroconductive polymer and the like, in a manner to coat it onto an outer periphery of the electroconductive columnar body 16 at a thickness of 50 to 500 μm. Further, as explained in FIG. 11, winding a copper wire which is thin in diameter, allows for obtainment of an extremely small-sized optical sensor or solar cell.

Figure 13:
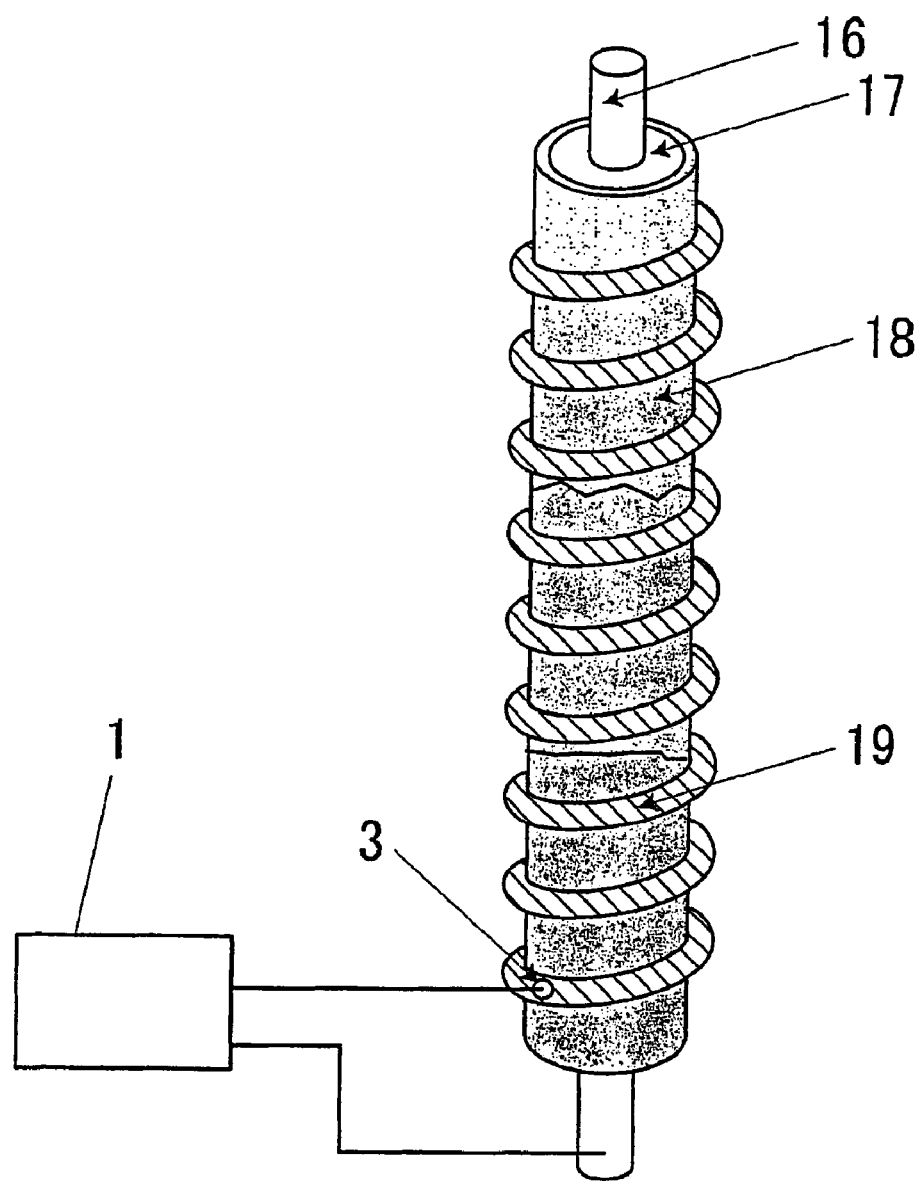
[FIG. 13] A perspective view of an optical sensor as another embodiment of a "columnar electric device having an electroconductive columnar body" according to the present invention.

FIG. 13 is a perspective view of an optical sensor as another embodiment of a "columnar electric device having an electroconductive columnar body" according to the present invention, and the same elements as those in FIG. 12 are denoted by the same reference numerals, respectively. It includes a transparent electrode 18 coated on an outside of a semiconductor 17. The optical sensor is configured with an electroconductive columnar body 16, the semiconductor 17, and the transparent electrode 18. Namely, there is generated an electric potential difference between the columnar body 16 and the transparent electrode 18 commensurately with an intensity of light directly irradiated to an exposed portion of the semiconductor 17 and irradiated thereto through the transparent electrode 18, and there is caused an electric current to flow between the columnar body and transparent electrode by connection thereof. However, there is a problem that the transparent electrode 18 is brittle, and tends to be broken due to cracks upon bending the same. As such, there is additionally wound an electroconductive wire 19 onto an outside of the transparent electrode 18, to fix the transparent electrode 18 while electrically contacting with the same, in the present invention.

Also coating the transparent electrode 18 is performed by vapor deposition, or application of a transparent electrode material in a melt, solution, or gel state. As the transparent electrode 18, there is adopted indium-tin-oxide (ITO), polyvinyl alcohol (PVA), and the like, for example. In adopting polyvinyl alcohol (PVA), it is desirable to include 2 wt % of iron trichloride ($FeCl_3$). At this time, there can be obtained the transparent electrode 18 excellent in electrical conductivity and transmittivity.

The electroconductive wire 19 such as a copper wire is additionally wound onto an outside of the transparent electrode 18. The winding of the electroconductive wire 19 is desirably performed in the same manner as the winding of a platinum wire explained in the "columnar electric device comprising a single wire". After winding the electroconductive wire 19, a tap 3 is mounted to the electroconductive wire 19 for completion.

Irradiation of light to the semiconductor 17 generates an electric potential difference between the columnar body 16 and transparent electrode 18, since the columnar body 16 made of aluminum and the transparent electrode 18 are different from each other in work function. It is possible to know an intensity of light irradiated to the semiconductor 17, by measuring the electric potential difference by a measuring instrument 1.

The optical sensor shown in FIG. 13 can also be utilized as a solar cell.

Also in this case, there can be obtained an extremely small-sized optical sensor or solar cell, by using an organic compound as the semiconductor 17 and transparent electrode 18, as well as the electroconductive wire 19 having a small diameter.

(Columnar Transistor)

It is also possible to produce a columnar transistor, according to the present invention. For example, there is coated an insulating material onto an insulative columnar body. The coating is performed by vapor deposition, or application of an insulating material in a melt, solution, or gel state. Two electroconductive wires are wound around an outside thereof, for completion. For winding the two electroconductive wires, it is desirable to adopt the method recited in any one of the ninth through fourteenth embodiments.

Figure 14:
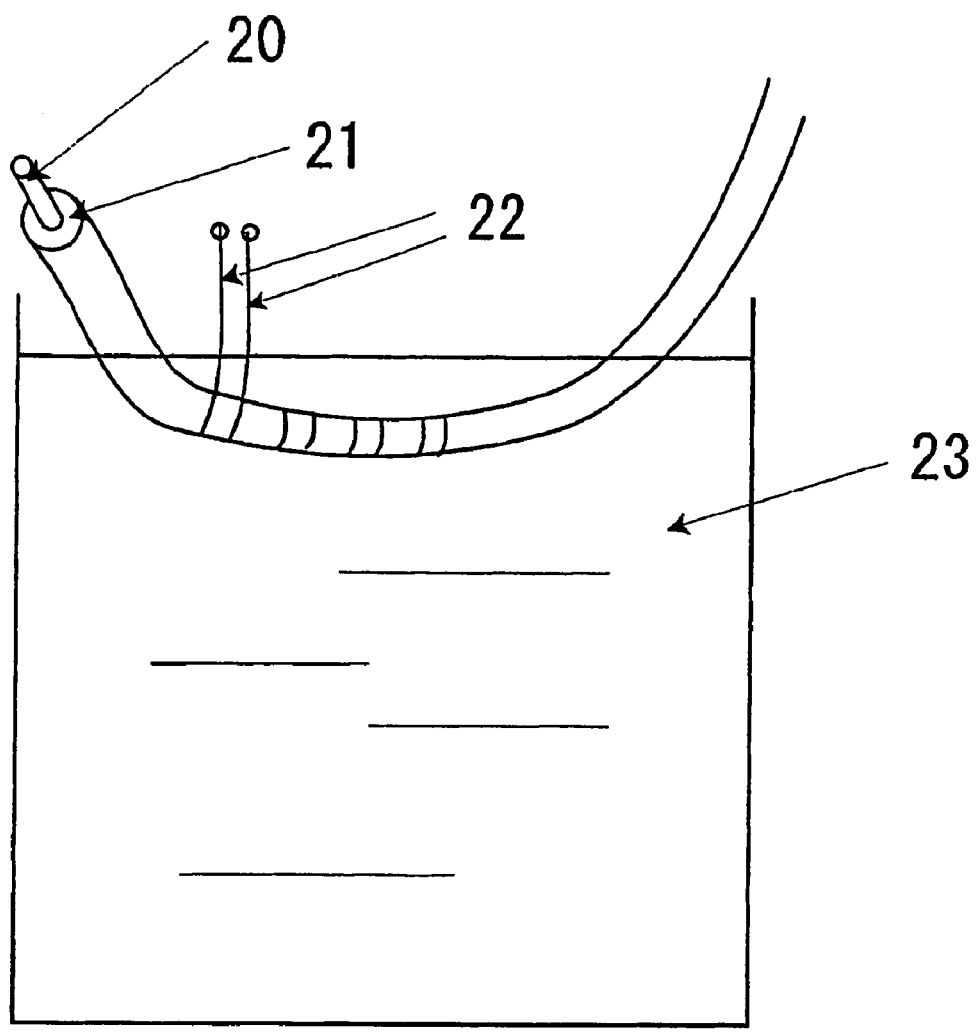
[FIG. 14] A schematic view of a doping method of a columnar transistor.

When the columnar transistor produced by this method can be bent, it is also possible to improve its performance by achievement of doping. FIG. 14 is a schematic view thereof. Immersed into a dopant solution 23 is a columnar transistor obtained by coating an insulating material 21 onto an electroconductive columnar body (gate electrode) 20 and by winding two electroconductive wires (source electrode and drain electrode) 22 therearound, such that the portion of the insulating material having the electroconductive wires wound thereon is immersed in the dopant solution. Further, there is applied a voltage to the gate electrode, thereby achieving doping of the coated insulating material 21. It is also possible to observe a state of the doping, by causing electric current to flow between the two electroconductive wires. Namely, it is possible to perform the doping at an appropriate amount for the insulating material 21, while confirming the state of the doping.

Note that although the insulative columnar bodies 2 and electroconductive columnar bodies 16 have been each expressed by a circular shape in longitudinal cross-section, these are not limited thereto. For example, rectangular shapes, polygonal shapes, and other shapes will do.

INDUSTRIAL APPLICABILITY

The columnar electric devices according to the present invention can be extremely downsized. Thus, the devices can be utilized as sensors and the like which are installed in narrow spaces such as gaps of machines, so as to measure a local temperature, gas concentration, and the like. Further, since it is possible to coat a sensitive portion based on semiconductor or the like onto the whole outer periphery of a columnar body, there can be obtained small-sized and highly sensitive sensors, and solar cells having higher conversion efficiencies.

The invention claimed is:

1. A sensor or solar cell configured with, at least:
   a columnar body; or a columnar body having a semiconductor film arranged on a surface thereof; and
   a first electroconductive wire and a second electroconductive wire in a shape that said first electroconductive wire and said second electroconductive wire are helically wound on said surface of said columnar body and separated from each other by a constant interval;
   wherein said first electroconductive wire is made of a material different from that of said second electroconductive wire.

2. The sensor or solar cell of claim 1, wherein said semiconductor film and/or said semiconductor wire comprises an organic semiconductor doped with fullerene.

* * * * *